US008273408B2

(12) United States Patent
Kim et al.

(10) Patent No.: US 8,273,408 B2
(45) Date of Patent: Sep. 25, 2012

(54) METHODS OF DEPOSITING A RUTHENIUM FILM

(75) Inventors: Jong Su Kim, Cheonan-si (KR); Hyung Sang Park, Seoul-si (KR)

(73) Assignee: ASM Genitech Korea Ltd. (KR)

( * ) Notice: Subject to any disclaimer, the term of this patent is extended or adjusted under 35 U.S.C. 154(b) by 879 days.

(21) Appl. No.: 12/250,827

(22) Filed: Oct. 14, 2008

(65) Prior Publication Data

US 2009/0104777 A1    Apr. 23, 2009

(30) Foreign Application Priority Data

Oct. 17, 2007  (KR) .................. 10-2007-0104509

(51) Int. Cl.
 *C23C 28/00*  (2006.01)
(52) U.S. Cl. ................................ 427/250; 427/255.31
(58) Field of Classification Search ............ 427/255.29, 427/255.31
See application file for complete search history.

(56) References Cited

U.S. PATENT DOCUMENTS

| | | | |
|---|---|---|---|
| 4,058,430 | A | 11/1977 | Suntola et al. |
| 4,210,608 | A | 7/1980 | Pinke |
| 4,477,296 | A | 10/1984 | Nair |
| 4,604,118 | A | 8/1986 | Bocko et al. |
| 4,670,110 | A | 6/1987 | Withers et al. |
| 4,860,687 | A | 8/1989 | Frijlink |
| 4,891,050 | A | 1/1990 | Bowers et al. |
| 4,902,551 | A | 2/1990 | Nakaso et al. |
| 4,965,656 | A | 10/1990 | Koubuchi et al. |
| 5,106,454 | A | 4/1992 | Allardyce et al. |
| 5,382,333 | A | 1/1995 | Ando et al. |
| 5,391,517 | A | 2/1995 | Gelatos et al. |
| 5,453,494 | A | 9/1995 | Kirlin et al. |
| 5,637,533 | A | 6/1997 | Choi |
| 5,695,810 | A | 12/1997 | Dubin et al. |
| 5,711,811 | A | 1/1998 | Suntola |
| 5,731,634 | A | 3/1998 | Matsuo et al. |
| 5,820,664 | A | 10/1998 | Gardiner et al. |
| 5,865,365 | A | 2/1999 | Nishikawa et al. |

(Continued)

FOREIGN PATENT DOCUMENTS

DE    41 08 7 3    8/1923

(Continued)

OTHER PUBLICATIONS

U.S. Appl. No. 10/728,126, filed Dec. 3, 2003, Granneman.

(Continued)

*Primary Examiner* — Matthew Daniels
*Assistant Examiner* — Erin Snelting
(74) *Attorney, Agent, or Firm* — Knobbe, Martens, Olson & Bear, LLP

(57) ABSTRACT

Cyclical methods of depositing a ruthenium layer on a substrate are provided. In one process, initial or incubation cycles include supplying alternately and/or simultaneously a ruthenium precursor and an oxygen-source gas to deposit ruthenium oxide on the substrate. The ruthenium oxide deposited on the substrate is reduced to ruthenium, thereby forming a ruthenium layer. The oxygen-source gas may be oxygen gas ($O_2$). The ruthenium oxide may be reduced by supplying a reducing agent, such as ammonia ($NH_3$) gas. The methods provide a ruthenium layer having good adherence to an underlying high dielectric layer while providing good step coverage over structures on the substrate. After nucleation, subsequent deposition cycles can be altered to optimize speed and/or conformality rather than adherence.

18 Claims, 5 Drawing Sheets

U.S. PATENT DOCUMENTS

| | | | |
|---|---|---|---|
| 5,884,009 A | 3/1999 | Okase | |
| 5,916,365 A | 6/1999 | Sherman | |
| 5,923,056 A | 7/1999 | Lee et al. | |
| 5,939,334 A | 8/1999 | Nguyen et al. | |
| 5,989,672 A | 11/1999 | Hayashi | |
| 5,998,048 A | 12/1999 | Jin et al. | |
| 6,006,763 A | 12/1999 | Mori et al. | |
| 6,015,986 A | 1/2000 | Schuegraf | |
| 6,033,584 A | 3/2000 | Ngo et al. | |
| 6,040,243 A | 3/2000 | Li et al. | |
| 6,063,705 A | 5/2000 | Vaartstra | |
| 6,066,892 A | 5/2000 | Ding et al. | |
| 6,074,945 A | 6/2000 | Vaartstra et al. | |
| 6,108,937 A | 8/2000 | Raaijmakers | |
| 6,124,189 A | 9/2000 | Watanabe et al. | |
| 6,130,123 A | 10/2000 | Liang et al. | |
| 6,133,159 A | 10/2000 | Vaartstra et al. | |
| 6,136,163 A | 10/2000 | Cheung et al. | |
| 6,139,700 A | 10/2000 | Kang et al. | |
| 6,143,658 A | 11/2000 | Donnelly et al. | |
| 6,144,060 A | 11/2000 | Park et al. | |
| 6,171,910 B1 | 1/2001 | Hobbs et al. | |
| 6,203,613 B1 | 3/2001 | Gates et al. | |
| 6,268,291 B1 | 7/2001 | Andricacos et al. | |
| 6,270,572 B1 | 8/2001 | Kim et al. | |
| 6,281,125 B1 | 8/2001 | Vaartstra et al. | |
| 6,294,467 B1 | 9/2001 | Yokoyama et al. | |
| 6,297,539 B1 | 10/2001 | Ma et al. | |
| 6,303,500 B1 | 10/2001 | Jiang et al. | |
| 6,305,314 B1 | 10/2001 | Sneh et al. | |
| 6,306,756 B1 | 10/2001 | Hasunuma et al. | |
| 6,320,213 B1 | 11/2001 | Kirlin et al. | |
| 6,323,131 B1 | 11/2001 | Obeng et al. | |
| 6,335,280 B1 | 1/2002 | Van der Jeugd | |
| 6,342,277 B1 | 1/2002 | Sherman | |
| 6,346,151 B1 | 2/2002 | Jiang et al. | |
| 6,359,159 B1 | 3/2002 | Welch et al. | |
| 6,380,080 B2 | 4/2002 | Visokay | |
| 6,391,785 B1 | 5/2002 | Satta et al. | |
| 6,395,650 B1 | 5/2002 | Callegari et al. | |
| 6,403,414 B2 | 6/2002 | Marsh | |
| 6,404,191 B2 | 6/2002 | Daughton et al. | |
| 6,420,189 B1 | 7/2002 | Lopatin | |
| 6,433,432 B2 | 8/2002 | Shimizu | |
| 6,444,568 B1 | 9/2002 | Sundararajan et al. | |
| 6,444,868 B1 | 9/2002 | Vaughn et al. | |
| 6,455,424 B1 | 9/2002 | McTeer et al. | |
| 6,464,779 B1 | 10/2002 | Powell et al. | |
| 6,475,276 B1 | 11/2002 | Elers et al. | |
| 6,478,931 B1 | 11/2002 | Wadley et al. | |
| 6,482,733 B2 | 11/2002 | Raaijmakers et al. | |
| 6,482,740 B2 | 11/2002 | Soininen et al. | |
| 6,511,539 B1 | 1/2003 | Raaijmakers | |
| 6,534,395 B2 | 3/2003 | Werkhoven et al. | |
| 6,541,067 B1 | 4/2003 | Marsh et al. | |
| 6,551,399 B1 | 4/2003 | Shen et al. | |
| 6,576,053 B1 | 6/2003 | Kim et al. | |
| 6,586,330 B1 | 7/2003 | Ludviksson et al. | |
| 6,593,656 B2 | 7/2003 | Ahn et al. | |
| 6,617,173 B1 | 9/2003 | Shen | |
| 6,617,248 B1* | 9/2003 | Yang | 438/686 |
| 6,649,091 B2 | 11/2003 | Ryan et al. | |
| 6,656,748 B2 | 12/2003 | Hall et al. | |
| 6,664,192 B2 | 12/2003 | Satta et al. | |
| 6,679,951 B2 | 1/2004 | Soininen et al. | |
| 6,680,540 B2 | 1/2004 | Nakano et al. | |
| 6,703,708 B2 | 3/2004 | Werkhoven et al. | |
| 6,713,381 B2 | 3/2004 | Barr et al. | |
| 6,720,262 B2 | 4/2004 | Koh et al. | |
| 6,759,325 B2 | 7/2004 | Raaijmakers et al. | |
| 6,777,331 B2 | 8/2004 | Nguyen | |
| 6,784,101 B1 | 8/2004 | Yu et al. | |
| 6,784,504 B2 | 8/2004 | Derderian et al. | |
| 6,800,542 B2 | 10/2004 | Kim | |
| 6,800,567 B2 | 10/2004 | Cho et al. | |
| 6,824,816 B2 | 11/2004 | Aaltonen et al. | |
| 6,842,740 B1 | 1/2005 | Jeran et al. | |
| 6,849,122 B1 | 2/2005 | Fair | |
| 6,852,635 B2 | 2/2005 | Satta et al. | |
| 6,878,628 B2 | 4/2005 | Sophie et al. | |
| 6,881,260 B2 | 4/2005 | Marsh et al. | |
| 6,881,437 B2 | 4/2005 | Ivanov et al. | |
| 6,887,795 B2 | 5/2005 | Soininen | |
| 6,921,712 B2 | 7/2005 | Soininen et al. | |
| 6,933,225 B2 | 8/2005 | Werkhoven et al. | |
| 6,936,535 B2 | 8/2005 | Kim et al. | |
| 6,955,986 B2 | 10/2005 | Li | |
| 6,984,591 B1 | 1/2006 | Buchanan et al. | |
| 7,011,981 B2 | 3/2006 | Kim et al. | |
| 7,018,675 B2* | 3/2006 | Yang | 427/250 |
| 7,067,407 B2 | 6/2006 | Kostamo | |
| 7,105,054 B2 | 9/2006 | Lindfors | |
| 7,107,998 B2 | 9/2006 | Greet et al. | |
| 7,118,779 B2 | 10/2006 | Verghese et al. | |
| 7,135,207 B2 | 11/2006 | Min et al. | |
| 7,183,604 B2 | 2/2007 | Cartier | |
| 7,220,451 B2 | 5/2007 | Aaltonen et al. | |
| 7,220,669 B2 | 5/2007 | Hujanen et al. | |
| 7,241,677 B2 | 7/2007 | Soininen et al. | |
| 7,256,144 B2 | 8/2007 | Koyanagi et al. | |
| 7,273,526 B2 | 9/2007 | Shinriki et al. | |
| 7,273,814 B2 | 9/2007 | Matsuda | |
| 7,300,873 B2 | 11/2007 | Millward | |
| 7,404,985 B2 | 7/2008 | Chang et al. | |
| 7,419,903 B2 | 9/2008 | Haukka et al. | |
| 7,435,484 B2 | 10/2008 | Shinriki et al. | |
| 7,438,949 B2 | 10/2008 | Weidman | |
| 7,476,618 B2 | 1/2009 | Kilpela et al. | |
| 7,494,927 B2 | 2/2009 | Kostamo et al. | |
| 7,541,284 B2 | 6/2009 | Park | |
| 7,601,223 B2 | 10/2009 | Lindfors et al. | |
| 7,615,480 B2 | 11/2009 | Boyd | |
| 7,655,564 B2 | 2/2010 | Shinriki | |
| 7,666,773 B2 | 2/2010 | Huotari et al. | |
| 2001/0041250 A1 | 11/2001 | Werkhoven et al. | |
| 2003/0059535 A1 | 3/2003 | Luo et al. | |
| 2003/0100162 A1 | 5/2003 | Joo | |
| 2003/0121608 A1 | 7/2003 | Chen et al. | |
| 2003/0219991 A1 | 11/2003 | Geusic et al. | |
| 2004/0028952 A1 | 2/2004 | Cartier et al. | |
| 2004/0041194 A1 | 3/2004 | Marsh | |
| 2004/0142558 A1 | 7/2004 | Granneman | |
| 2004/0152255 A1 | 8/2004 | Seidl et al. | |
| 2004/0192021 A1 | 9/2004 | Li | |
| 2004/0192036 A1 | 9/2004 | Koyanagi et al. | |
| 2004/0214354 A1 | 10/2004 | Marsh et al. | |
| 2004/0216668 A1 | 11/2004 | Lindfors et al. | |
| 2004/0224475 A1 | 11/2004 | Lee et al. | |
| 2005/0009325 A1 | 1/2005 | Chung et al. | |
| 2005/0020060 A1 | 1/2005 | Aaltonen et al. | |
| 2005/0048794 A1 | 3/2005 | Brask et al. | |
| 2005/0082587 A1 | 4/2005 | Marsh | |
| 2005/0085031 A1 | 4/2005 | Lopatin et al. | |
| 2005/0087879 A1 | 4/2005 | Won et al. | |
| 2005/0089632 A1 | 4/2005 | Vehkamaki et al. | |
| 2005/0092247 A1 | 5/2005 | Schmidt et al. | |
| 2005/0098440 A1 | 5/2005 | Kailasam et al. | |
| 2005/0118807 A1 | 6/2005 | Kim et al. | |
| 2005/0124154 A1 | 6/2005 | Park et al. | |
| 2005/0181555 A1 | 8/2005 | Haukka et al. | |
| 2005/0208754 A1 | 9/2005 | Kostamo et al. | |
| 2005/0229848 A1 | 10/2005 | Shinriki et al. | |
| 2005/0238808 A1 | 10/2005 | Gatineau et al. | |
| 2005/0266700 A1 | 12/2005 | Jursich et al. | |
| 2005/0271812 A1 | 12/2005 | Myo et al. | |
| 2006/0013955 A1 | 1/2006 | Senzaki | |
| 2006/0035462 A1 | 2/2006 | Millward | |
| 2006/0073276 A1 | 4/2006 | Antonissen | |
| 2006/0076597 A1* | 4/2006 | Agarwal et al. | 257/296 |
| 2006/0093848 A1 | 5/2006 | Senkevich et al. | |
| 2006/0118968 A1 | 6/2006 | Johnson et al. | |
| 2006/0121733 A1 | 6/2006 | Kilpela et al. | |
| 2006/0128150 A1 | 6/2006 | Gandikota et al. | |
| 2006/0137608 A1 | 6/2006 | Choi et al. | |
| 2006/0165892 A1 | 7/2006 | Weidman | |
| 2006/0177601 A1 | 8/2006 | Park et al. | |
| 2006/0211228 A1 | 9/2006 | Matsuda | |

| | | |
|---|---|---|
| 2006/0216932 A1 | 9/2006 | Kumar et al. |
| 2006/0223300 A1 | 10/2006 | Simka et al. |
| 2006/0263977 A1 | 11/2006 | Kim et al. |
| 2007/0014919 A1 | 1/2007 | Hamalainen et al. |
| 2007/0026654 A1 | 2/2007 | Huotari et al. |
| 2007/0036892 A1 | 2/2007 | Haukka et al. |
| 2007/0059502 A1 | 3/2007 | Wang et al. |
| 2007/0082132 A1 | 4/2007 | Shinriki et al. |
| 2007/0190782 A1 | 8/2007 | Park et al. |
| 2008/0038465 A1 | 2/2008 | Dussarrat |
| 2008/0054472 A1 | 3/2008 | Shinriki et al. |
| 2008/0124484 A1 | 5/2008 | Shinriki et al. |
| 2008/0146042 A1 | 6/2008 | Kostamo et al. |
| 2008/0171436 A1 | 7/2008 | Koh et al. |
| 2008/0200019 A9 | 8/2008 | Huotari et al. |
| 2008/0206982 A1 | 8/2008 | Suzuki |
| 2008/0206985 A1 | 8/2008 | Kim et al. |
| 2008/0214003 A1 | 9/2008 | Xia |
| 2008/0296768 A1 | 12/2008 | Chebiam |
| 2008/0315418 A1 | 12/2008 | Boyd |
| 2008/0318417 A1 | 12/2008 | Shinriki et al. |
| 2009/0068832 A1 | 3/2009 | Haukka et al. |
| 2009/0087339 A1 | 4/2009 | Shinriki |
| 2009/0155997 A1 | 6/2009 | Shinriki |
| 2009/0163024 A1 | 6/2009 | Kim et al. |
| 2009/0209101 A1 | 8/2009 | Shinriki et al. |
| 2010/0055433 A1 | 3/2010 | Shinriki et al. |

FOREIGN PATENT DOCUMENTS

| | | |
|---|---|---|
| EP | 0 469 456 | 7/1991 |
| EP | 0 469 470 | 2/1992 |
| EP | 0 880 168 | 11/1998 |
| EP | 1 688 923 | 8/2006 |
| GB | 368850 | 12/1930 |
| GB | 1518243 | 7/1978 |
| GB | 2340508 | 2/2000 |
| JP | 10-340994 | 12/1998 |
| JP | 2003-168738 A | 6/2003 |
| KR | 10-2001-004717 | 1/2001 |
| KR | 10-2001-004718 | 1/2001 |
| KR | 10-2001-004719 | 1/2001 |
| KR | 10-2001-96408 | 11/2001 |
| KR | 10-2001-112889 | 12/2001 |
| KR | 10-2003-0011399 | 2/2003 |
| KR | 10-2005-0103373 | 10/2005 |
| WO | WO 93/10652 | 5/1993 |
| WO | WO 98/01890 | 1/1998 |
| WO | WO 99/17343 | 4/1999 |
| WO | WO 00/03420 | 1/2000 |
| WO | WO 00/38191 | 6/2000 |
| WO | WO 01/88972 | 5/2001 |
| WO | WO 01/50502 | 7/2001 |
| WO | WO 02/09126 | 1/2002 |
| WO | WO 02/09158 | 1/2002 |
| WO | WO 03/023835 | 3/2003 |
| WO | WO 03/040150 | 5/2003 |
| WO | WO 03/056612 | 7/2003 |
| WO | WO 2004/035858 | 4/2004 |
| WO | WO 2006/035281 | 4/2006 |

OTHER PUBLICATIONS

U.S. Appl. No. 11/367,177, filed Mar. 3, 2006, Shinriki et al.
U.S. Appl. No. 11/469,828, filed Sep. 1, 2009, Shinriki et al.
U.S. Appl. No. 11/557,891, filed Nov. 8, 2006, Shinriki et al.
U.S. Appl. No. 11/972,081, filed Jan. 10, 2008, Koh.
Aaltonen et al., "Ruthenium Thin Film Grown by Atomic Layer Deposition," Chem. Vap. Deposition, 9[1], 45, 2003.
Aoyama, Tomonori., et al., "Ruthenium Films Prepared by Liquid Source Chemical Vapor Deposition Using Bis-(ethylcyclopentadienyl)ruthenium". Jpn. J. Appl. Phys., vol. 38 (1999) pp. L1134-L1136.
Hur'yeva, Tetyana, et al., "Ruthenium Films Deposited by Liquid-Delivery MOCVD using Bis(ethylcyclopentadienyl)ruthenium with Toulene as the Solvent". Chemical Vapor Deposition 2006, 12, pp. 429-434.
Kadota, Takumi et al., "Ruthenium Films Deposited under H2 by MOCVD using a Novel Liquid Precursor". IEEE article, pp. 175-176, no date available.

Onda et al., "DC-Hydrogen Plasma Cleaning a Novel Process for IC-Packaging", SEMICON West 97, Packaging Materials Conference, 1997, pp. D-1-D-10.
Park et al., "Metallorganic Chemical Vapor Deposition of Ru and $RuO_2$ using Ruthenocene Precursor and Oxygen Gas," J.Electrochem. Soc., 147[1], 203, 2000.
Tung et al., Atomic Layer Deposition of Noble Metals: Exploration of the low limit of the deposition temperature, J. Mater. Res., vol. 19, No. 11, p. 3353-3357 (Nov. 2004).
U.S. Appl. No. 12/337,141, filed Dec. 17, 2008, Kim et al.
U.S. Appl. No. 10/782,727, filed Feb. 18, 2004, Lindfors et al.
U.S. Appl. No. 60/976,378, filed Sep. 28, 2007, Shinriki, H.
U.S. Appl. No. 61/178,871, filed May 15, 2009, Hamalainen et al.
Aaltonen et al., Atomic Layer Deposition of Ruthenium Thin Films from $Ru(thd)_3$ and Oxygen, Chem. Vap. Deposition, 2004, vol. 10, Issue 4, pp. 215-219.
Aaltonen et al., Reaction Mechanism Studies on Atomic Layer Deposition of Ruthenium and Platinum, Electrochem. Solid-State Lett., 2003, vol. 6, pp. C130-C133.
Aaltonen et al., ALD of Rhodium Thin Films from $Rh (acac)_3$ and Oxygen, Electrochem. Solid-State Lett., 2005, vol. 8, Issue 8, pp. C99-C101.
Aaltonen et al., Atomic Layer Deposition of Iridium Thin Films, J. Electrochem. Soc., 2004, vol. 151, Issue 8, pp. G489-G492.
Aaltonen et al., Atomic Layer Deposition of Noble Metal Thin Films, dissertation presented at the University of Helsinki, 2005, Helsinki, Finland.
Aaltonen et al., Atomic Layer Deposition of Noble Metals: Exploration of the Low Limit of the Deposition Temperature, J. Mat. Res. Soc., 2004, vol. 19, Issue 11, pp. 3353-3358.
Aaltonen et al., Atomic Layer Deposition of Platinum Thin Films, Chem. Mater., 2003, vol. 15, pp. 1924-1928.
Addison et al., The Vapour Pressure of Anhydrous Copper Nitrate, and its Molecular Weight in the Vapour State, J. Chem. Soc., 1958, pp. 3099-3106.
Akerman et al, Identifying Tunneling in Ferromagnetic-Insulator-Ferromagnetic Thin Film Structures, World Wide Web, physics.ucsd.eduiksgrp/Tunneling.html , Sep. 10, 2008, pp. 1-7.
Aoyama et al., Chemical Vapor Deposition of Ru and Its Application in (Ba, Sr) TiO3 Capacitors for Future Dynamic Random Access Memories, Jpn. J. Appl. Phys. , 1999, vol. 38, Issue 43, pp. 2194-2199.
Arnal et al., Materials and Processes for High Signal Propagation Performance and Reliable 32 nm node BEOL., 1-4244-1069-X/07, 2007, pp. 1-3.
Baliga, New Designs and Materials Tackle 1 Gb Memory Challenges, Semiconductor International, World Wide Web: semiconductor.net, Nov. 2000.
Baklanov et al., Characterization of Cu Surface Cleaning by Hydrogen Plasma, Journal Vac. Sci. Technol, Jul./Aug. 2001, vol. 19, Issue 4, pp. 1201-1211.
Basceri, Electrical and Dielectric Properties of (Ba,Sr) $TiO_3$ Thin Film Capacitors for Ultra-High Density Dynamic Random Access Memories, Thesis, NC State University, 1997, pp. 13-31, Raleigh, NC, USA.
Bobo et al., Spin Dependent Tunneling Junctions with Hard Magnetic Layer Pinning, Journal of Applied Physics, 1998, vol. 83, Issue 11, pp. 6685-6687.
Bursky, Hit up IEDM for Gigabit and Denser DRAMs and Merged Logic/Memory, Electronic Design, Dec. 1, 1998.
Campbell et al., Titanium dioxide ($TiO_2$)-based gate insulators, IBM J. Res. Develop., May 1999, vol. 43, Issue 3, pp. 383-392.
Daughton, Advanced MRAM Concepts, World Wide Web, nve.com/otherbiz/mram2.pdf, Feb. 7, 2001, pp. 1-6.
Fereday et al., Anhydrous Cobalt (III) Nitrate Chemical Communications, Chemical Communications, 1968, pp. 271.
Fukuzumi et al., Liner-Supported Cylinder (LSC) Technology to Realize $Ru/Ta_2O_5/Ru$ Capacitor for Future DRAMs, IEEE, IED, 2000, vol. Session 34.
Fullerton et al., Advanced Magnetic Recording Media for High-Density Data, Solid State Technology, 2001, vol. 44, Issue i9, pp. 87.

Hones et al., MOCVD of Thin Ruthenium Oxide Films: Properties and Growth Kinetics, Chem. Vap. Deposition, 2000, vol. 6, Issue 4, pp. 193-198.

Hoyas et al., Growth and Characterization of Atomic Layer Deposited WC0.7N0.3 on Polymer Films, Journal of Applied Physics, Jan. 1, 2004, vol. 95, Issue 1, pp. 381-388.

Hu et al., In Situ Rapid Thermal Oxidation and Reduction of Copper Thin Films and Their Applications in Ultralarge Scale Integration, Journal of the Electrochemical Society, 2001, vol. 148, Issue 12, pp. G669-G675.

Imai, 100 Gbit/Inch HDD Just Around the Corner, Tajuki World Wide Web, nikkeibp.asiabiztech.com/nea/200008/tech_108675.html, Aug. 2000, pp. 1-6.

Inoue et al., Low Thermal-budget Fabrication of Sputtered-PZT Capacitor on Multilevel Interconnects for Embedded FeRAM, IEEE, IED 2000, 2000, vol. Session 34.

Integrated Circuit Engineering Corporation, Practical Integrated Circuit Fabrication Seminar, 1998.

Jeong et al., Plasma Enhanced Atomic Layer Deposition of Ru—TaN Thin Films for the Application of Cu Diffusion Barrier, ALD Conference, 2006, pp. 1-23.

Jung et al., "A Novel Ir/IrO$_2$/Pt-PZT-Pt/IrO$_2$/Ir Capacitor for a Highly Reliable Mega-Scale FRAM", IEEE, IED 2000, 2000, vol. Session 34.

Kawaguchi, MPEG1 Decoder LSI for Video CD mPD61012NEC Device Technology International, NEC Device Technology International, New Products, Jan. 1998, vol. 5, Issue 48, pp. 4-8.

Kawamoto et al., The Outlook for Semiconductor Processes and Manufacturing Technologies in the 0.1-μm Age, Hitachi Review, 1999, vol. 48, Issue 6, pp. 334-339.

Kwon et al., Plasma-Enhanced Atomic Layer Deposition of Ruthenium Thin Films, Electrochemical and Solid State Letters, 2004, vol. 7, Issue 4, pp. C46-C48.

Kwon et al., Plasma-Enhanced Atomic Layer Deposition of RuTiN thin films for the Application of Copper Diffusion Barrier, ALD Conference, 2004.

Kwon et al., "Ruthenium Bottom Electrode Prepared by Electroplating for a High Density DRAM Capacitor," J. Electrochem. Soc. 151(2): C127-C132 (2004).

Lee et al., Electroless CoWP boosts cooper reliability, device performance, Semiconductor International, Jul. 1, 2004, pp. 5 pages.

Namba et al., PEALD of Ru layer on WNC ALD barrier for Cu/porous low-k, Proceedings of Advanced Metallization Conference 2006, p. 39.

NEC Device Technology International, Current State of Leading Edge ULSI Process Technology and Future Trends, 1998, vol. 48, pp. 4-8.

Nilsen et al., Thin Film Deposition of Lanthanum Manganite Perovskite by the ALE process, Journal of Materials Chemistry, 1999, vol. 9, pp. 1781-1784.

Onda et al., "Hydrogen plasma cleaning a novel process for IC-packaging," SEMICON West 97, Packaging Materials Conference, 1997, pp. D-1-D-10.

Pakrad, Pure Tech: Growth of MR/GMR Head Materials, World Wide Web, Puretechinc.com/tech_papers/tech_papers-4.htm, 1999, pp. 1-2.

Paranjpe et al., Atomic Layer Deposition of AlOx for thin Film Head Gap Applications, Journal of Electrochemical Society, V 148 (9), G465-G471.

Parsons et al., "Microcontact Patterning of Ruthenium Gate Electrodes by Selective Area," North Carolina State university, presentation at AVS conference on Atomic Layer Deposition (ALD 2004), Helsinki, Finland, Aug. 16, 2004.

Ritala et al., "Atomic Layer Deposition", Handbook of Thin Film Materials Deposition and Processing of Thin Films, 2002, vol. 1, Issue Chapter 2, pp. 103-159, San Diego.

Rossnagel, The Latest on Ru—Cu Interconnect Technology, Solid State Technology, Feb. 2005, pp. 1-4.

Sakurai et al., Adsorption of Ruthenium Tetroxide on Metal Surfaces, J. Phys. Chem American Chemical Society, 1985, vol. 89, pp. 1892-1896.

Satta et al., The Removal of Copper Oxides by Ethyl Alcohol Monitored in Situ by Spectroscopic Ellipsometry, Journal of the Electromechanical Society, 2003, vol. 5, Issue 150, pp. 300-306.

Shao, I. et al., An alternative low resistance MOL technology with electroplated rhodium as contact plugs for 32nm CMOS and beyond,1-4244-1070-3/07.

Singer, Progress in Copper: A Look Ahead, Semiconductor International, May 1, 2002.

SOI Technology: IBM's Next Advance in Chip Design, 1998.

Solanki et al., Atomic Layer Deposition of Copper Seed Layers, Electrochemical and Solid-State Letters, 2000, vol. 3, Issue 10, pp. 479-780.

Sundani et al., "Oral Presentation of Dual Damascene Process" [slides], Nov. 19, 1998.

Suntola, Atomic Layer Epitaxy, Handbook of Crystal Growth, 1994, vol. 3, Issue 14, pp. 601-663.

Ueno et al., Cleaning of CHF3 Plasma-Etched SiO2/SiN/Cu via Structures Using a Hydrogen Plasma, an Oxygen Plasma and Hexafluoracetylacetone Vapors, J. Vac. Sci. Technology, 1998, vol. 16, Issue 6, pp. 2986-2995.

Utriainen et al., Studies of Metallic Thin Film Growth in an Atomic Layer Epitaxy Reactor Using M(acac)$_2$ (M=Ni, Cu, Pt) Precursors, Applied Surface Science, 2000, vol. 157, pp. 151-158.

Utriainen et al., Studies of NiO Thin Film Formation by Atomic Layer Epitaxy, Materials Science and Engineering, 1998, vol. B54, pp. 98-103.

Wang, Advanced Materials for Extremely High Density Magnetic Recording Heads, Presentation: Department of Materials Science and Engineering, Department of Electrical Engineering, Stanford University, Stanford, CA 94305-4045, presentation.

Winbond News Release, Successful Development of Capacitor Technology for Next Generation Memory, World Wide Web: winbond. com, Dec. 13, 2000.

Won et al., Conformal CVD-Ruthenium Process for MIM Capacitor in Giga-Bit DRAMs, IEEE, IED, 2000, vol. Session 34.

World Wide Web: magahaus.com/tech/westerndigital/shitepapers/gmr_wp.shtml, "GMR Head Technology: Increased Areal Density and Improved Performance Areal Density," pp. 1-4, (Feb. 2000).

World Wide Web: pc.guide.com/ref/hdd/op/heads/techGMR-c.html, Giant Magnetoresistive (GMR) Heads, 2001, pp. 1-4.

World Wide Web: semiconductor.net/semiconductor/issues/Issues/1998/feb98/docs/emerging.asp, GMR Read-Write Heads Yield Data Storage Record, Feb. 1998, pp. 1-2.

World Wide Web: stoner.leeds.ac.uk/research/gmr.htm, Giant Magnetoresistance, pp. 1-6.

Xu et al., "A Breakthrough in Low-k Barrier/Etch Stop Films for Copper Damascene Applications", Semiconductor Fabtech, 2000, Vol. 11th edition, pp. 239-244.

Yagishita et al., Cleaning of Copper Surface Using Vapor-Phase Organic Acids, MRS Proceedings, MRS Spring 2003 Meeting, Apr. 21-25, 2003, vol. 766, Symposium E, Issue Session #3, pp. Paper E3.28.

Yang et al., Physical, Electrical, and Relaiability Characterization of Ru for Cu Interconnects, 2006 International Interconnect Technology Conference, pp. 187-190, ISBN 1-4244-0103-8/06, 2006 IEEE.

Yoon et al., 197th Meeting Program Information II, The Electrochemical Society, 197th Meeting—Toronto, Ontario, Canada, May 14-18, 2000, Program Information, I1-Rapid Thermal and Other Short-Time Processing Technologies I, Electronics Division/Dielectric Science and Technology Division/High Temperature Materials Division, 2000, Wednesday, May 17, 2000, New Applications of RTP, Co-Chairs: A. Fiory and D.-L Kwong, time 11:10 Abs#550, Title: Development of RTA Process for the Crystallization of a-Si Thin Film—Y.-G. Yoong, T.-K. Kim, K.-B. Kim J.-Y. Chio, B.-I Lee, and S.-K. Joo (Seoul National Univ.).

Yoon et al., Investigation of RuO$_2$-Incorporated Pt layer as a Bottom Electrode and Diffusion Barrier for High Epsilon Capacitor Applications, Electrochemical and Solid-State Letters, 2000, vol. 3, Issue 8, pp. 373-376.

Yoon et al., "Development of an RTA process for the enhanced crystallization of amorphous silicon thin films," Electrochemical Society Proceedings, 2000, pp. 337-343, vol. 2000-9.

Yoon et al., "Tantalum-ruthenium dioxide as a diffusion barrier between Pt bottom electrode and TiSi2 ohmic contact layer for high density capacitors," Journal of Applied Physics 86(5): 2544-2549 (1999).

* cited by examiner

METHODS OF DEPOSITING A RUTHENIUM FILM

CROSS-REFERENCE TO RELATED APPLICATIONS

This application claims priority to and the benefit of Korean Patent Application No. 10-2007-0104509 filed in the Korean Intellectual Property Office on Oct. 17, 2007, the entire contents of which are incorporated herein by reference.

BACKGROUND OF THE INVENTION

1, Field of the Invention

The present invention relates to a method of forming a layer on a substrate. Particularly, the present invention relates to methods of forming a ruthenium layer on a substrate.

2, Description of the Related Art

A ruthenium metal layer has been researched for use as an electrode material, for example, a gate electrode material for memory devices. Recently, various applications of ruthenium (e.g., as an electrode material for a DRAM and a diffusion barrier for a copper line) have drawn attention. When a ruthenium layer forms an electrode on a structure having a high aspect ratio (e.g., a DRAM capacitor), the ruthenium layer typically should have a thickness of at least about 10 nm. A physical deposition method can be used to form a ruthenium film. An exemplary physical deposition method is a sputtering method, but sputtering tends not to exhibit good step coverage, particularly in high aspect ratio applications like DRAM capacitors.

Chemical vapor deposition (CVD) methods of forming thin films of ruthenium (Ru) or ruthenium dioxide ($RuO_2$) are also known. Such CVD methods use an organometallic compound of ruthenium, such as a ruthenium cyclopentadienyl compound or bis(ethylcyclopentadienyl)ruthenium (Ru$(EtCp)_2$) and oxygen ($O_2$) gas as reactants. An exemplary method is disclosed by Park et al., "Metallorganic Chemical Vapor Deposition of Ru and $RuO_2$ Using Ruthenocene Precursor and Oxygen Gas," J. Electrochem. Soc., 147[1], 203, 2000, CVD, employing simultaneous provision of multiple reactants, also suffers from less than perfect conformality.

Atomic layer deposition (ALD) methods of forming ruthenium thin films are also known. Generally, ALD involves sequential introduction of separate pulses of at least two reactants until a layer of a desired thickness is deposited through self-limiting adsorption of monolayers of materials on a substrate surface. For example, in forming a thin film including an AB material, a cycle of four sequential steps of: (1) a first reactant gas A supply; (2) an inert purge gas supply; (3) a second reactant gas B supply; and (4) an inert purge gas supply is repeated. Examples of the inert gas are argon (Ar), nitrogen ($N_2$), and helium (He).

For example, an ALD process can be conducted at a substrate temperature of about 200° C. to about 400° C. and a process pressure of about several hundred mTorr to several tens of Torr, using a ruthenium cyclopentadienyl compound (for example, liquid bis(ethylcyclopentadienyl)ruthenium [Ru$(EtCp)_2$]) and oxygen ($O_2$) gas as reactants. Such a process can form a ruthenium layer having a thickness of about 0.1 Å to 0.5 Å per cycle of supplying the reactants. See Aaltonen et al. "Ruthenium Thin Film Grown by Atomic Layer Deposition," Chem. Vap. Deposition, 9[1], 45 2003.

The above information disclosed in this Background section is only for enhancement of understanding of the background of the invention and therefore it may contain information that does not form prior art.

SUMMARY OF THE INVENTION

In one embodiment, a method of depositing a ruthenium film includes: loading a substrate into a reactor; and conducting a plurality of deposition cycles. At least one of the cycles includes steps of: supplying a ruthenium precursor to the reactor; supplying oxygen ($O_2$) gas to the reactor; and supplying ammonia (NH3) gas to the reactor after supplying the ruthenium precursor and the oxygen gas without supplying the ruthenium precursor and the oxygen gas.

In another embodiment, a method of depositing a ruthenium film includes: loading a substrate into a reactor; and conducting a plurality of deposition cycles. At least one of the cycles includes steps of: supplying a ruthenium precursor to the reactor; supplying an oxygen-source gas to the reactor to deposit oxidized ruthenium on the substrate; and reducing the oxidized ruthenium deposited on the substrate to ruthenium with non-plasma ammonia (NH3) gas.

DETAILED DESCRIPTION OF THE PREFERRED EMBODIMENT

Figure 1:
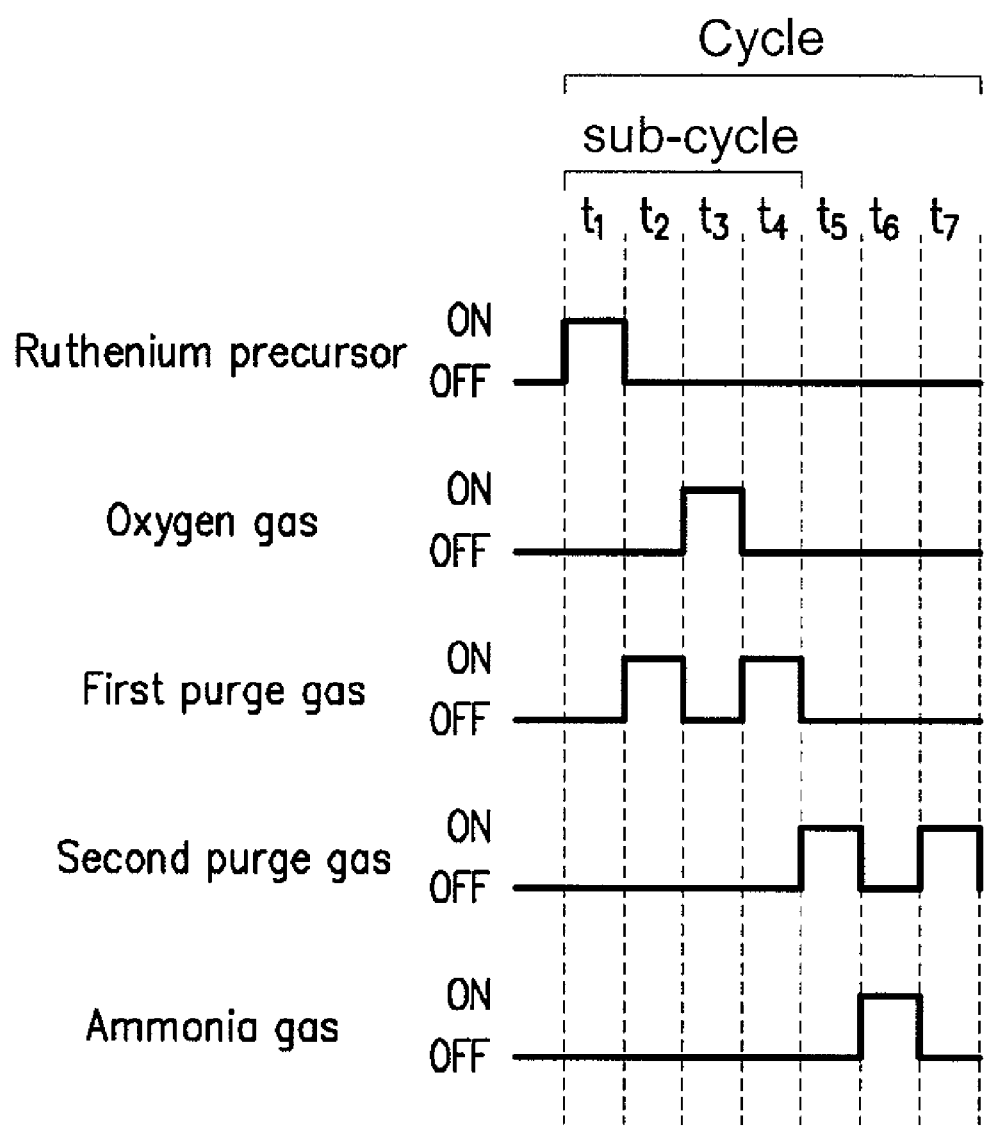
FIG. 1 is a timing diagram illustrating a deposition method including gas supply cycles for formation of a ruthenium layer according to one embodiment.

The present invention will be described more fully hereinafter with reference to the accompanying drawings, in which exemplary embodiments are shown. As those skilled in the art would realize, the embodiments may be modified in various different ways, all without departing from the spirit or scope of the present invention.

When a ruthenium thin film is formed by a conventional ALD process, using oxygen gas ($O_2$) as one of reactants, such a ruthenium film can have a relatively high density of, for example, about 12 g/cm². However, when such a ruthenium film is formed on a layer having a high dielectric constant, such as for an integrated circuit upper electrode formed over a capacitor high k dielectric, the ruthenium film tends not to adhere to the underlying high dielectric layer. Accordingly, the ruthenium thin film may be detached from the underlying layer during a subsequent process, such as a heat treatment process.

In addition, a conventional ALD process may require a long initial incubation or nucleation period (for example, 20 cycles to about 150 cycles) before the actual deposition starts. The term "initial incubation period" refers to a term during which a ruthenium film may not be sufficiently deposited because it is difficult to form initial nuclei. As is known in the art, the incubation period is characterized by a slow deposition rate relative to steady state after full coverage of the target substrate; after the incubation period, a uniform or constant deposition rate is obtained. Thus, an ALD process may take longer time than other types of processes such as CVD, both due to the longer incubation period and the inherent slowness of the monolayer-per-cycle, cyclical process.

As an attempt to solve the above-mentioned problems (that is, poor adherence and long initial incubation time), a ruthenium film may be formed on a substrate by forming an oxidized ruthenium ($RuO_x$) film on the substrate and reducing the film to a ruthenium film. Such a process can have a deposition rate of over 1 Å/cycle. The process may have an initial incubation period that is relatively very short, for example, less than about 10 cycles. However, the process involves a reduction process for reducing an oxidized ruthenium ($RuO_x$) film to a ruthenium (Ru) film. Such a reduction process is typically performed by a heat treatment, which may cause a crack in the ruthenium film because of potential phase formation.

In one embodiment, a method of depositing a ruthenium film includes loading a substrate into a reactor. The method also includes conducting one or more deposition cycles. At least one of the cycles may include supplying a ruthenium precursor to the reactor, and supplying an oxygen-source gas to the reactor to deposit ruthenium oxide ($RuO_x$) on the substrate. The ruthenium oxide deposited on the substrate is reduced to ruthenium, thereby forming a ruthenium layer. The ruthenium precursor may be a compound containing at least one ruthenium atom and one or more ligands bonding to the ruthenium atom. The oxygen-source gas may be oxygen gas ($O_2$) and/or ozone ($O_3$) gas. The ruthenium oxide may be reduced by supplying a reducing agent, such as ammonia ($NH_3$) gas, to the reactor. In the embodiments described below, ammonia plasma is not used as a reducing agent.

In some embodiments, a method may include one or more cycles, each of which that may include simultaneously and/or alternately supplying a ruthenium precursor and an oxygen-source gas before reducing the ruthenium oxide. In other embodiments, each cycle can include repeating supplying the ruthenium precursor and the oxygen-source gas before reducing the ruthenium oxide. In certain embodiments, each cycle may further include supplying the ruthenium precursor and supplying the oxygen-source gas after reducing the ruthenium oxide, and supplying ammonia ($NH_3$) gas to the reactor thereafter. In another embodiment, a method may includes, in sequence: simultaneously and/or alternately supplying a ruthenium precursor and an oxygen-source gas to form a ruthenium oxide as a seed layer; reducing the ruthenium oxide to ruthenium; and performing ALD cycles by supplying the ruthenium precursor and the oxygen-source gas.

Referring to FIG. 1, a deposition method for formation of a ruthenium layer according to one embodiment will be described below. FIG. 1 is a timing diagram illustrating a gas supply cycle for the formation of a ruthenium layer.

In the illustrated embodiment, a substrate on which a ruthenium film is to be deposited is loaded into a reactor. The reactor can be a chemical vapor deposition reactor or an atomic layer deposition reactor. A skilled artisan will appreciate that various configurations of reactors can be adapted for the method. In one embodiment, the substrate can have at least one structure or feature (e.g., protrusions, vias, or trenches). In other embodiments, the substrate can have a surface that is substantially planar, and a ruthenium film is formed on the surface.

The illustrated method includes supplying a ruthenium precursor for a first time period t1; supplying a first purge gas for a second time period t2; supplying oxygen ($O_2$) gas for a third time period t3; supplying the first purge gas for a fourth time period t4; supplying a second purge gas for a fifth time period t5; supplying ammonia ($NH_3$) gas for a sixth time period t6; and supplying the second purge gas for a seventh time period t7. In one embodiment, the durations of the first to seventh time periods t1-t7 can be as shown in Table 1, A skilled artisan will understand that the durations of the time periods t1-t7 can vary widely, depending on, for example, the volume and structure of the reactor. In certain embodiments, the first and second purge gases can be supplied from the same purge gas source, and thus the timing diagrams of these purge gases can be consolidated into one.

TABLE 1

| Time Period | Duration | Alternative Duration |
|---|---|---|
| First time period t1 | about 0.1 sec to about 60 sec | about 1.0 sec to about 10 sec |
| Second time period t2 | about 0.1 sec to about 60 sec | about 1.0 sec to about 10 sec |
| Third time period t3 | about 0.1 sec to about 60 sec | about 1.0 sec to about 10 sec |
| Fourth time period t4 | about 0.1 sec to about 60 sec | about 1.0 sec to about 10 sec |
| Fifth time period t5 | about 1.0 min to about 20 min | about 5.0 min to about 10 min |
| Sixth time period t6 | about 1.0 min to about 20 min | about 5.0 min to about 10 min |
| Seventh time period t7 | about 1.0 min to about 20 min | about 5.0 min to about 10 min |

The ruthenium precursor may be a compound containing a ruthenium (Ru) atom and one or more ligands bonding to the ruthenium atom. The ruthenium precursor may include a ruthenium-containing compound that can react with an oxygen-source gas such as $O_2$ or $O_3$. In one embodiment, the ruthenium precursor can be a compound represented by Ru(XaXb), wherein Xa and Xb are cyclopentadienyl groups such as any one of cyclopentadienyl(Cp), methylcyclopentadienyl(MeCp), ethylcyclopentadienyl(EtCp) and isopropyl-cyclopentadienyl(i-PrCp). Examples of such ruthenium precursors include, but are not limited to, bis(cyclopentadienyl)ruthenium($Ru(Cp)_2$) and bis(ethylcyclopentadienyl)ruthenium ($Ru(EtCp)_2$). In the illustrated embodiment, the ruthenium precursor is bis(ethylcyclopentadienyl)ruthenium ($Ru(EtCp)_2$). In other embodiments, the ruthenium precursor may be ruthenium octanedionate ($Ru(OD)_3$), ruthenium tetramethylheptadionate($Ru(thd)_3$), or $RuO_4$. A skilled artisan will, however, appreciate that any ruthenium-containing compound suitable for use as a ruthenium precursor in ALD and/or CVD can be provided during the first time period t1.

Examples of inert gases that can be used as either or both of the first and second purge gases include, but are not limited to, Ar, He, $N_2$, or a combination of two or more of the foregoing. In one embodiment, the first and second purge gases can be the same as each other. In other embodiments, the first and second purge gases can be different from each other. In the illustrated embodiment, the first purge gas may be Ar, and the second purge gas may also be Ar. In such a case, Ar may be continuously supplied during the fourth and fifth periods t4, t5 from the same purge gas source. In some embodiments, one or more of the purge gas supplying steps that are conducted for the second, fourth, fifth, and seventh time periods t2, t4, t5 and t7 may be omitted, depending upon the relative reactivity of sequential gases.

In the illustrated embodiment, the ruthenium precursor can have a flow rate of about 20 sccm to about 1,000 sccm. The oxygen gas can have a flow rate of about 20 sccm to about 1,000 sccm. The first purge gas can have a flow rate of about 20 sccm to about 1,000 sccm. The second purge gas can have a flow rate of about 20 sccm to about 1,000 sccm. The ammonia gas can have a flow rate of about 20 sccm to about 1,000 sccm.

In one embodiment, the ruthenium precursor can be carried by about 100 sccm of Ar carrier gas. In such an embodiment, the flow rates of the oxygen gas, the first purge gas, the second purge gas, and the ammonia gas can be about 200 sccm, about 400 sccm, about 400 sccm, and about 500 sccm, respectively. A skilled artisan will, however, appreciate that the flow rates of the reactants and purge gases can vary widely, depending on, for example, the volume and structure of the reactor. In one embodiment, the temperature of the reactor may be about 200° C. to about 400° C.

In one embodiment, the steps performed during the first to seventh time periods t1-t7 described above in connection with FIG. 1 form a cycle. The cycle may be repeated until a ruthenium layer having a desired thickness is deposited.

In other embodiments, a cycle may include two or more sub-cycles, each of which may include the steps of: supplying a ruthenium precursor; supplying a first purge gas; supplying oxygen ($O_2$) gas; and supplying the first purge gas. In certain embodiments, each of the sub-cycles can include the steps conducted during the first to fourth time periods t1-t4 shown in FIG. 1. These steps are denoted as "sub-cycle" in FIG. 1. The cycle may further include, in sequence, supplying a second purge gas, supplying ammonia ($NH_3$) gas, and supplying the second purge gas again after the completion of the two or more sub-cycles. These steps may be the same as the steps conducted during the fifth to seventh time periods t5-t7 shown in FIG. 1. In other words, each cycle can include multiple sub-cycles for depositing monolayers of ruthenium oxide ($RuO_x$) prior to application of the ammonia gas. Such a cycle can be repeated until a ruthenium layer having a desired thickness is deposited.

In the illustrated embodiment, during the first time period t1, the ruthenium precursor is substantially continuously supplied over the substrate in the reactor. The ruthenium precursor is chemically adsorbed on the substrate to form a ruthenium precursor adsorption layer. The first purge gas is supplied for the second time period t2 to the reactor to remove and discharge excess ruthenium precursor from the reactor. The oxygen ($O_2$) gas is supplied for the third time period t3 over the substrate, on which the ruthenium precursor adsorption layer has been formed. The oxygen gas strips or replaces at least some of the ligands (e.g., ethylcyclopentadienyl groups) of the ruthenium precursor adsorbed on the substrate, thereby forming a ruthenium-containing thin film. The ruthenium-containing thin film may also contain oxygen atoms. In the illustrated embodiment, the ruthenium-containing thin film may contain ruthenium oxide ($RuO_x$), where x is about 0.01 to about 4, or alternatively about 0.1 to about 2.5.

Subsequently, the first purge gas is supplied again for the fourth time period t4 over the substrate to remove and discharge excess reactants and reaction by-products from the reactor. The second purge gas is supplied for the fifth time period t5. The ammonia ($NH_3$) gas is supplied for the sixth time period t6 over the substrate to reduce oxygen (if present) in the ruthenium-containing thin film. The supply of the ammonia ($NH_3$) gas may be maintained for a time period to sufficiently remove oxygen from the ruthenium-containing thin film. For example, about 75% to about 100% of oxygen in the ruthenium-containing film may be removed during this step. In one embodiment, the ammonia gas can be supplied for a time period that is equal to or less than 10 minutes. In the illustrated embodiment, the ammonia gas serves primarily as a reducing agent. A skilled artisan will, however, appreciate that a minimal amount (for example, less than about 1 atomic %) of nitrogen may remain in the resulting ruthenium layer. The second purge gas is supplied again for the seventh time period t7 over the substrate to remove excess reactants and reaction by-products from the reactor.

In certain embodiments, a deposition method may include a plurality of cycles to form a ruthenium layer. Each of the cycles may include a first number of sub-cycles for forming ruthenium oxide, which is followed by application of ammonia gas to reduce the ruthenium oxide to ruthenium (i.e., to remove oxygen atoms from the ruthenium oxide). The first number is selected so as to form a ruthenium layer having a first thickness sufficient to provide full coverage of the dielectric such that the incubation or nucleation stage is complete. While theoretically one full monolayer of Ru is sufficient for this purpose, the first thickness is preferably greater than a monolayer (for example, about 1 nm to about 5 nm). The first thickness may be substantially thinner than a desired total thickness of the ruthenium layer to be formed by the plurality of cycles. For example, the first thickness may be, for example, about 1/20 to about 1/5 of the desired total thickness of the ruthenium layer.

The first thickness may be selected so as to prevent or minimize the formation of pores in the ruthenium layer that would otherwise occur due to the removal of oxygen atoms from a thicker ruthenium oxide layer. Such pores may be formed in the layer having the first thickness, but the selected thickness of ruthenium-containing layer prior to application of ammonia is such that subsequent cycles can fill the pores, thereby allowing the resulting ruthenium layer to be substantially free of such pores. In contrast, if a single reduction step by ammonia gas is conducted after forming a ruthenium-containing layer thick enough to form ruthenium of the desired total thickness (that is, ammonia reduction step(s) are not performed during the nucleation phase), the resulting ruthenium layer would likely include buried pores therein due to the late removal of oxygen gases.

Accordingly, the embodiments described above allow forming a ruthenium layer that is not detached from the underlying layer having a high dielectric constant during subsequent processes. In addition, the deposition method is performed by atomic layer deposition, which provides a ruthenium thin film on the order of a monolayer or less per cycle, thus having good step coverage on a substrate including features formed thereon.

Figure 2:
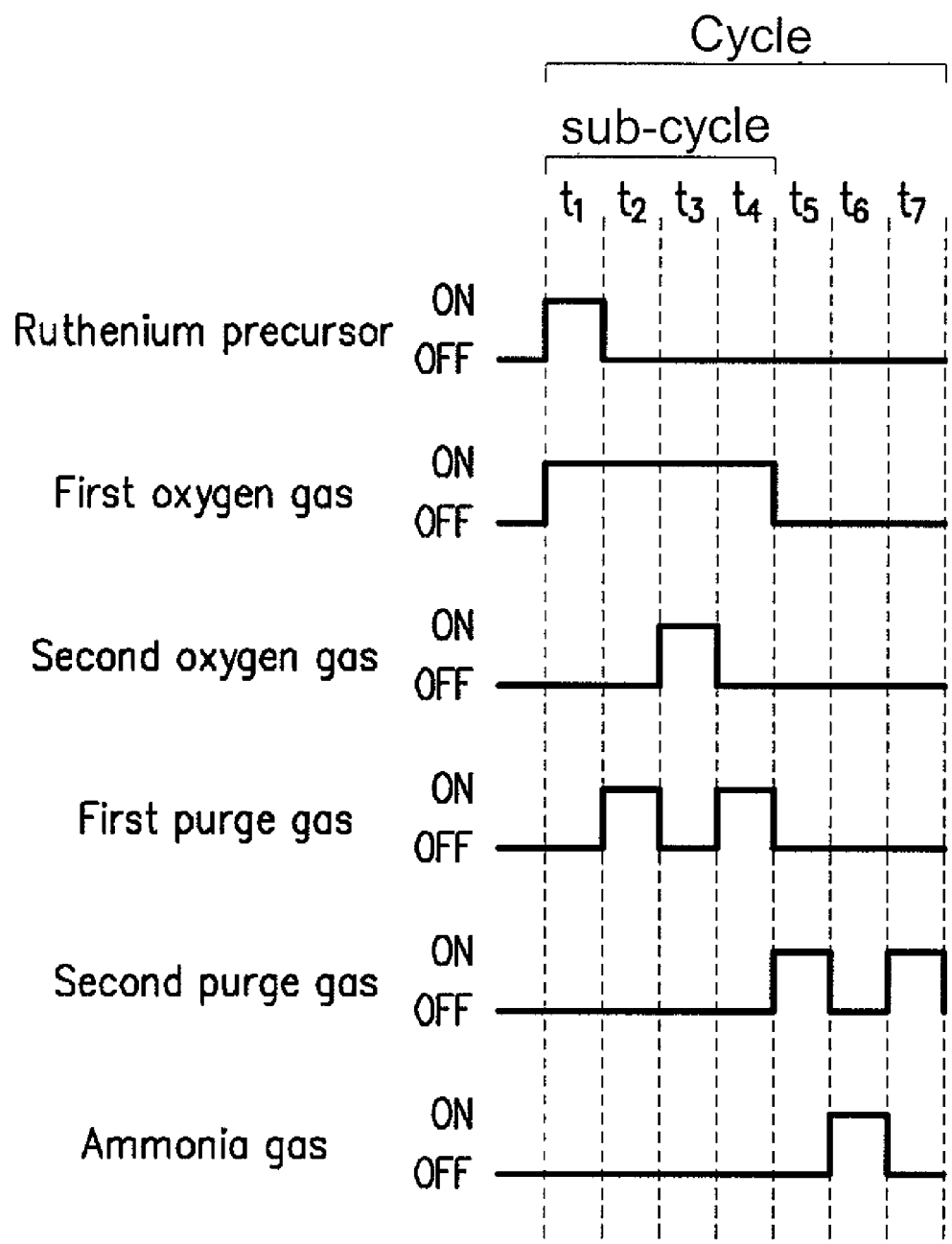
FIG. 2 is a timing diagram illustrating a deposition method including gas supply cycles for formation of a ruthenium layer according to another embodiment.

Referring to FIG. 2, a deposition method for formation of a ruthenium layer according to another embodiment will be described below. In the illustrated embodiment, a first oxygen ($O_2$) gas is substantially continuously supplied at a substantially constant flow rate for first to fourth time periods t1 to t4 to a reactor into which a substrate has been loaded. A ruthenium precursor is supplied for the first time period t1 to the reactor. A first purge gas is supplied for a second time period t2 to the reactor. A second oxygen ($O_2$) gas is supplied for a third time period t3 to the reactor. The first purge gas is supplied again for the fourth time period t4 to the reactor. Subsequently, a second purge gas is supplied for a fifth time period t5 to the reactor, and ammonia ($NH_3$) gas is supplied for a sixth time period t6 to the reactor. The second purge gas is supplied again for a seventh time period t7 to the reactor.

In some embodiments, the first and second oxygen gases can be supplied from the same oxygen gas source, and thus the timing diagrams of these gases can be consolidated into one. In certain embodiments, the first and second purge gases can be supplied from the same purge gas source, and thus the timing diagrams of these purge gases can be consolidated into one.

In one embodiment, the durations of the first to seventh time periods t1 to t7 may be about 0.2 seconds to about 10 seconds. The purging durations of the second time period t2, the fourth time period t4, the fifth time period t5, and the seventh time period t7 for supplying the first and second purge gases may be shorter than those of the other time periods t1, t3, and t6. In other embodiments, the durations of the first to seventh time periods t1 to t7 can be as described above in connection with FIG. 1. A skilled artisan will, however, appreciate that the durations of the first to seventh time periods t1 to t7 can vary widely, depending on the volume and structure of the reactor.

In the illustrated embodiment, the flow rates of the ruthenium precursor, the first and second purge gases, and the ammonia gas can be as described above in connection with FIG. 1. In addition, the first oxygen gas can have a flow rate of about 20 sccm to about 1,000 sccm. The second oxygen gas can have a flow rate of about 20 sccm to about 1,000 sccm. In certain embodiments, the step of supplying the second oxygen gas may be omitted.

In one embodiment, the ruthenium precursor can be carried by about 100 sccm of Ar carrier gas. In such an embodiment, the flow rates of the first oxygen gas, the second oxygen gas, the first purge gas, the second purge gas, and the ammonia gas can be about 30 sccm, about 200 sccm, about 400 sccm, about 400 sccm, and about 500 sccm, respectively. A skilled artisan will, however, appreciate that the flow rates of the reactants and purge gases can vary widely, depending on, for example, the volume and structure of the reactor.

The first and second purge gases may be an inert gas such as argon (Ar), nitrogen ($N_2$), or helium (He). In some embodiments, one or more of the purge gas supplying steps that are conducted for the second, fourth, fifth, and seventh time periods t2, t4, t5 and t7 may be omitted, depending upon the relative reactivity of sequential gases and the acceptability of CVD-type reactions.

The ammonia ($NH_3$) gas may be supplied such that oxygen in a ruthenium-containing film resulting from the steps of the first to fourth time periods t1-t4 may be sufficiently reduced. In certain embodiments, the ammonia gas in time period t6 may be supplied for a time period that is equal to or less than 10 minutes. In one embodiment, the temperature of the reactor may be about 200° C. to about 400° C. Other details of the steps conducted during the first to seventh time periods t1-t7 can be as described above with respect to FIG. 1.

In one embodiment, the steps performed during the first to fourth time periods t1 to t4 may form a sub-cycle. In some embodiments, the sub-cycle may be repeated two or more times before supplying the second purge gas during the fifth time period t5. One or more of the sub-cycles and the steps conducted during the fifth to the seventh time period t5 to t7 can form a cycle. In other words, each cycle can include multiple sub-cycles for depositing monolayers of ruthenium oxide ($RuO_x$) prior to application of the ammonia gas. The cycle can be repeated until a ruthenium layer having a desired thickness is deposited.

In the illustrated embodiment, the first oxygen ($O_2$) gas is substantially continuously supplied for the first to the fourth time periods t1 to t4. No oxygen gas is supplied during the sixth time period t6 for supplying the ammonia gas (t6) and the fifth and seventh time periods t5, t7 for supplying the second purge gas. At least a portion of the ruthenium precursor supplied for the first time period t1 is adsorbed on the surface of the substrate while excess ruthenium precursor may remain unadsorbed (in the gas phase) within the reactor. During the first time period t1, the excess ruthenium precursor may react with the first oxygen ($O_2$) gas supplied for the first time period t1 to form a ruthenium-containing layer (containing, for example, $RuO_x$). In addition, the ruthenium precursor adsorbed on the surface of the substrate may also react with the first oxygen ($O_2$) gas. Furthermore, the adsorbed ruthenium precursor may also react with an increased amount of oxygen gas (e.g., by supplying the second oxygen ($O_2$) gas or increasing the flow rate of the first oxygen gas) for the third time period t3 to form the ruthenium-containing layer.

In the illustrated embodiment, either or both of a reaction (CVD) between simultaneously supplied vapor-phase reactants and a surface reaction (ALD) between alternately supplied reactants may occur during the sub-cycle. Thus, the deposition rate may be higher than a conventional ALD process. Furthermore, the incubation period of the method can be shorter than a conventional ALD process. In one embodiment, the incubation period can be about 50 cycles compared to about 400 cycles that is needed in a conventional ALD process.

In addition, the deposition method includes the step of reducing oxygen in the ruthenium thin film by supplying the ammonia ($NH_3$) gas after formation of the ruthenium-containing thin film (e.g., oxidized ruthenium film). This step removes a substantial portion of oxygen atoms from the ruthenium-containing layer. Thus, a ruthenium layer having a high degree of purity may be formed.

Figure 3:
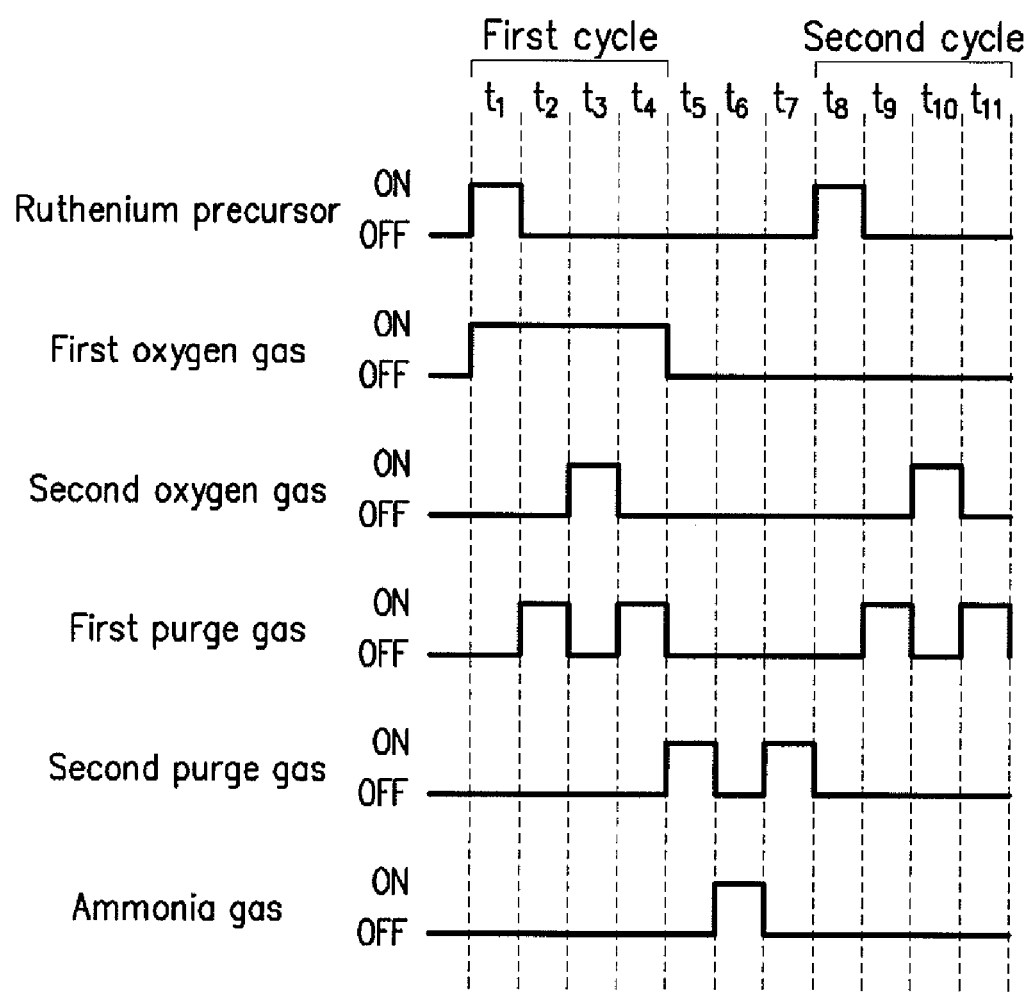
FIG. 3 is a timing diagram illustrating a deposition method including gas supply cycles for formation of a ruthenium layer method according to yet another embodiment.

Referring to FIG. 3, a deposition method for formation of a ruthenium layer according to another embodiment will be described below. In the illustrated embodiment, a first oxygen ($O_2$) gas is supplied substantially continuously for a first time period to a fourth time period t1 to t4 at a substantially constant flow rate to a reactor into which a substrate has been loaded. A ruthenium precursor is supplied for the first time period t1 over the substrate. A first purge gas is supplied for a second time period t2 to the reactor. A second oxygen ($O_2$) gas is supplied for a third time period t3 over the substrate. The first purge gas is supplied again for a fourth time period t4 to the reactor.

After an oxidized ruthenium layer having a desired thickness is formed, a second purge gas is supplied for a fifth time period t5. Ammonia ($NH_3$) gas is supplied for a sixth time period t6 over the substrate. Then, the second purge gas is supplied for a seventh time period t7. The supply of the ammonia ($NH_3$) gas may be continued until the deposited oxidized ruthenium layer is sufficiently reduced to a ruthenium film.

Subsequently, the ruthenium precursor is supplied again over the substrate for an eighth time period t8. The first purge gas is supplied again for a ninth time period t9. The second oxygen ($O_2$) gas is supplied for a tenth time period t10, and then the first purge gas is supplied for an eleventh time period t11.

In some embodiments, the first and second oxygen gases can be supplied from the same oxygen gas source, and thus the timing diagrams of these gases can be consolidated into one. In certain embodiments, the first and second purge gases can be supplied from the same purge gas source, and thus the timing diagrams of these purge gases can be consolidated into one.

In one embodiment, the duration of each step of supplying gas is about 0.2 seconds to about 10 seconds. The first and second purge gases may an inert gas such as argon (Ar), nitrogen ($N_2$), or helium (He). In certain embodiments, at least one of the steps of supplying the first and second purge gases may be omitted. The supply of the ammonia (NH$_3$) gas may be maintained such that oxygen atoms in the oxidized ruthenium layer may be sufficiently reduced to a ruthenium layer. The supply of the ammonia gas may be continued for a time period equal to or less than 10 minutes. The flow rates of the gases can be as described above with respect to the sub-cycle of FIG. 2. In one embodiment, the temperature of the reactor may be about 200° C. to about 400° C. A skilled artisan will appreciate that the durations of the steps can vary widely, depending on the volume and structure of the reactor.

The steps performed during the first to fourth time periods t1 to t4 may form a first cycle. In certain embodiments, the first cycle can be repeated several times, several tens of times, or several hundred times until an oxidized ruthenium layer having a desired thickness is deposited. In addition, the steps performed during the eighth to eleventh time periods t8, t9, t10, and t11 can form a second cycle. The second cycle can be repeated several times, several tens of times, or several hundred times until a ruthenium layer having a desired thickness is deposited.

In the embodiment described above in connection with FIG. 3, an oxidized ruthenium layer having a selected thickness is deposited by repeating one or more of first cycles (t1 to t4) followed by supplying ammonia (NH$_3$) gas to obtain a good quality nucleation film that adheres well to the underlying substrate, particularly to underlying dielectric or high k dielectric. The ammonia gas reduces the oxidized ruthenium layer to a ruthenium layer. After the ruthenium nucleation layer is deposited, one or more of second cycles (t8 to t11) are repeated such that a ruthenium layer having a desired thickness may be formed on the substrate. In certain embodiments, another reduction step using ammonia gas may be optionally conducted after the second cycle(s) to remove oxygen (if present) from the layer resulting from the second cycle(s).

Figure 4:
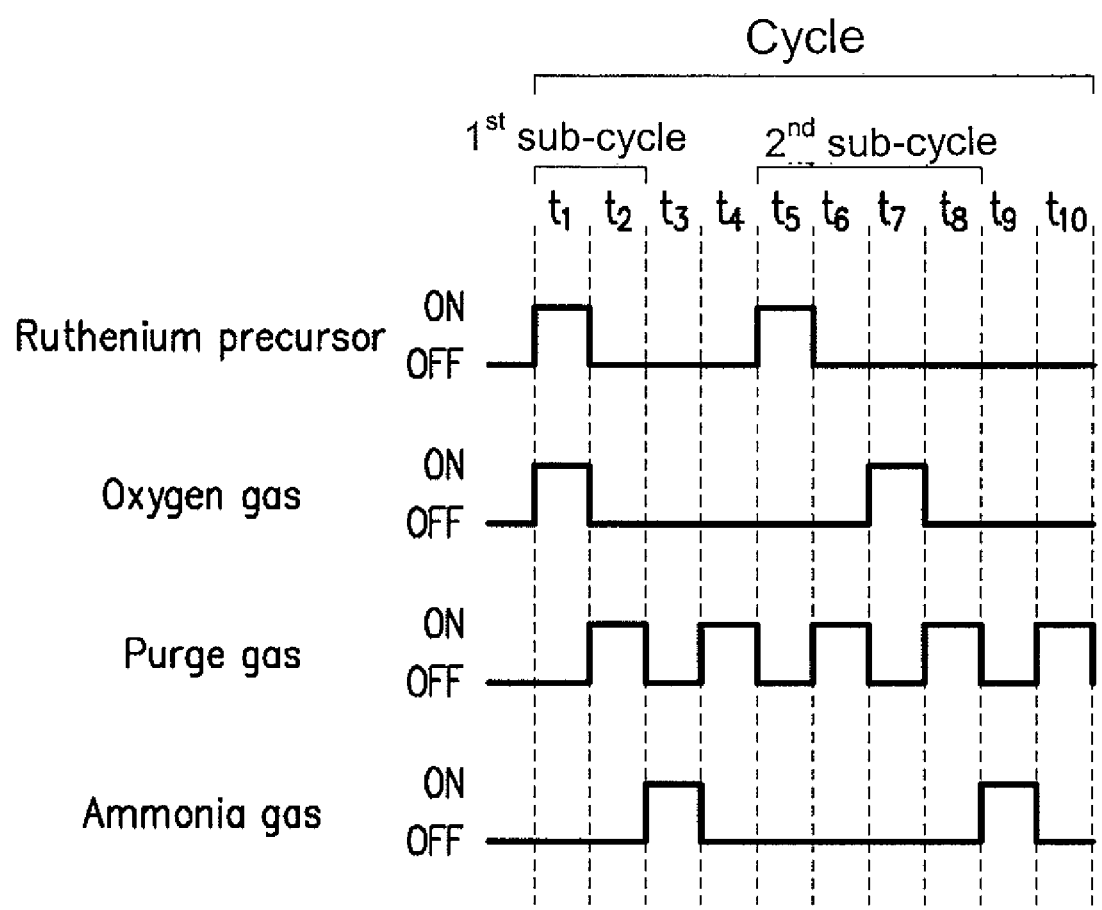
FIG. 4 is a timing diagram illustrating a deposition method including gas supply cycles for formation of a ruthenium layer according to yet another embodiment.

Referring to FIG. 4, a deposition method for formation of a ruthenium layer according to another embodiment will be described below. In the illustrated embodiment, a ruthenium precursor and oxygen (O$_2$) gas are simultaneously supplied over a substrate in a reactor for a first time period t1 to form an oxidized ruthenium layer on a substrate. The oxidized ruthenium layer is formed by a reaction between simultaneously supplied vapor phase reactants (CVD reactions). Then, a purge gas is supplied to the reactor to remove excess reactants and reaction by-products from the reactor. In certain embodiments, the steps performed during the first and second time periods t1, t2 form a first sub-cycle, which can be repeated several times, several tens of times, or several hundred times.

Subsequently, ammonia (NH$_3$) gas is supplied for a third time period t3 to remove oxygen from the oxidized ruthenium layer. A purge gas is supplied to the reactor for a fourth time period t4 to remove remaining ammonia gas from the reactor.

Next, the ruthenium precursor is supplied again for a fifth time period t5 to be adsorbed on the surface of the substrate. A purge gas is supplied for a sixth time period t6 to remove excess ruthenium precursor. Oxygen (O$_2$) gas is supplied over the substrate for a seventh time period t7 such that the adsorbed ruthenium precursor reacts with the oxygen (O$_2$) gas to form an oxidized ruthenium thin film. A purge gas is supplied to remove and discharge excess reactants and reaction by-products. In certain embodiments, the steps performed during the fifth to eighth time periods t5, t6, t7, and t8 form a second sub-cycle, which can be repeated several times, several tens of times, or several hundred times until a ruthenium layer having a desired thickness is deposited.

Subsequently, ammonia (NH$_3$) gas is supplied for a ninth time period t9 to remove oxygen from the ruthenium layer. A purge gas is supplied to the reactor for a tenth time period t10 to remove excess reactants and reaction by-products from the reactor.

One or more of first sub-cycles (t1 and t2), the steps conducted during the third and fourth time periods t3 and t4, one or more of second sub-cycles (t5 to t8), and the steps conducted during the ninth and tenth time periods t9 and t10 can form a cycle. The ratio of first sub-cycles to second sub-cycles in the cycle will determine the overall deposition rate, composition and conformality. The cycle may be repeated until a ruthenium layer having a desired thickness is deposited.

In one embodiment, the duration of each step of supplying gas may be about 0.2 seconds to about 10 seconds. The purge gas may be an inert gas such as argon (Ar), nitrogen (N$_2$), or helium (He). In certain embodiments, at least one of the steps of supplying the purge gas may be omitted. The supply of the ammonia (NH$_3$) gas may be maintained for a time period such that oxygen in the oxidized ruthenium layer may be sufficiently reduced. The time period can be equal to or less than 10 minutes In one embodiment, the temperature of the reactor may be about 200° C. to about 400° C. A skilled artisan will appreciate that the durations of the steps can vary widely, depending on the volume and structure of the reactor.

In the embodiment described above in connection with FIG. 4, the ruthenium precursor and the oxygen gas are simultaneously supplied in the first sub-cycle(s). At least some portions of the ruthenium precursor and the oxygen gas react with each other to form an oxidized ruthenium layer on the substrate by CVD. Then, ammonia (NH$_3$) gas is supplied to reduce oxygen in the oxidized ruthenium layer. Subsequently, in the second sub-cycle(s), the ruthenium precursor is supplied to be adsorbed on the surface of the substrate. The oxygen (O$_2$) gas is sequentially and separately supplied over the substrate such that the ligands of the ruthenium precursor are removed from the adsorbed ruthenium precursor to form an oxidized ruthenium thin film by ALD. Ammonia (NH$_3$) gas is supplied to remove oxygen from the oxidized ruthenium thin film.

As described above, the illustrated deposition method includes depositing an oxidized ruthenium layer by a reaction (CVD) between simultaneously supplied vapor-phase ruthenium precursor and oxygen gas during the first sub-cycle(s). The method also includes depositing the oxidized ruthenium layer by a surface reaction (ALD) between separately supplied ruthenium precursor and oxygen gas during the second sub-cycle(s). The CVD may form an oxidized ruthenium layer having good adhesion to an underlying layer for a shorter incubation time and at a higher deposition rate than the ALD. Accordingly, due to a CVD component to the overall process, the deposition rate may be higher than that of a conventional atomic layer deposition method; while the ALD component lends greater conformality compared to a conventional CVD method.

In addition, after the deposition of the oxidized ruthenium layer and the ruthenium layer, ammonia (NH$_3$) gas is supplied to reduce oxygen in the oxidized ruthenium layer. Thus, a ruthenium layer having a good adherence property to the underlying layer can be deposited. Repeating the cycle prior to periodically reducing oxygen in the film close to the surface of the growing layer thus avoids buried bubble or void formation. Rather than returning to the first cycles, however, often the incubation period, just the second sub-cycle and ammonia exposure can be conducted to complete the desired Ru layer thickness. The resulting ruthenium thin film has good step coverage on a substrate having features formed thereon.

Figure 5A:
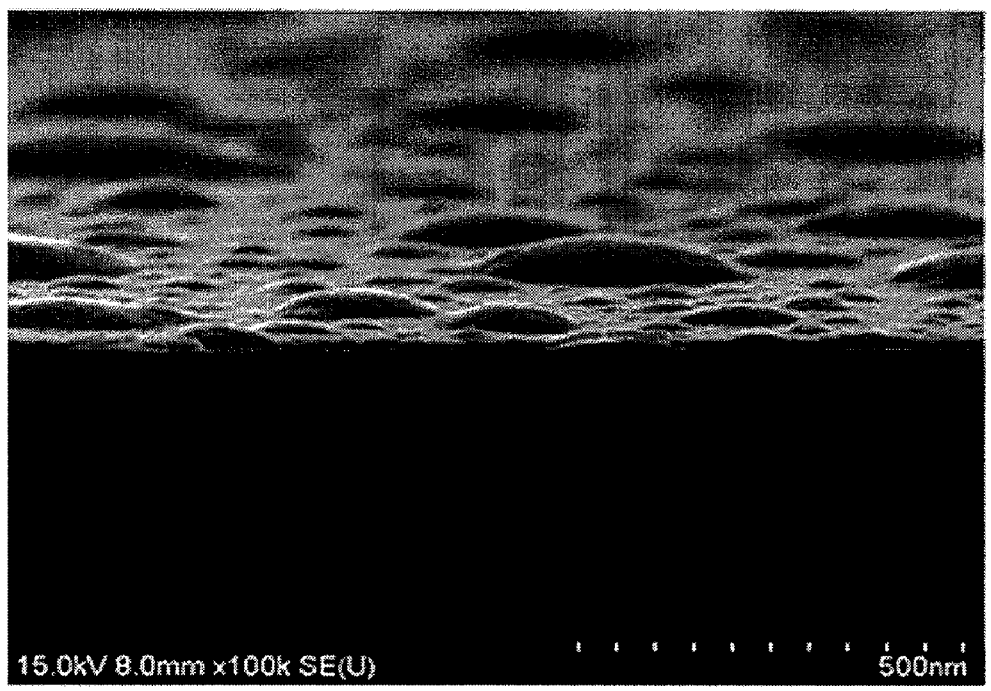
FIGS. 5A and 5B are micrographs, taken with a scanning electron microscope, of the surfaces of Ru films deposited by a conventional ALD method and the method of FIG. 3, respectively.
Figure 5B:
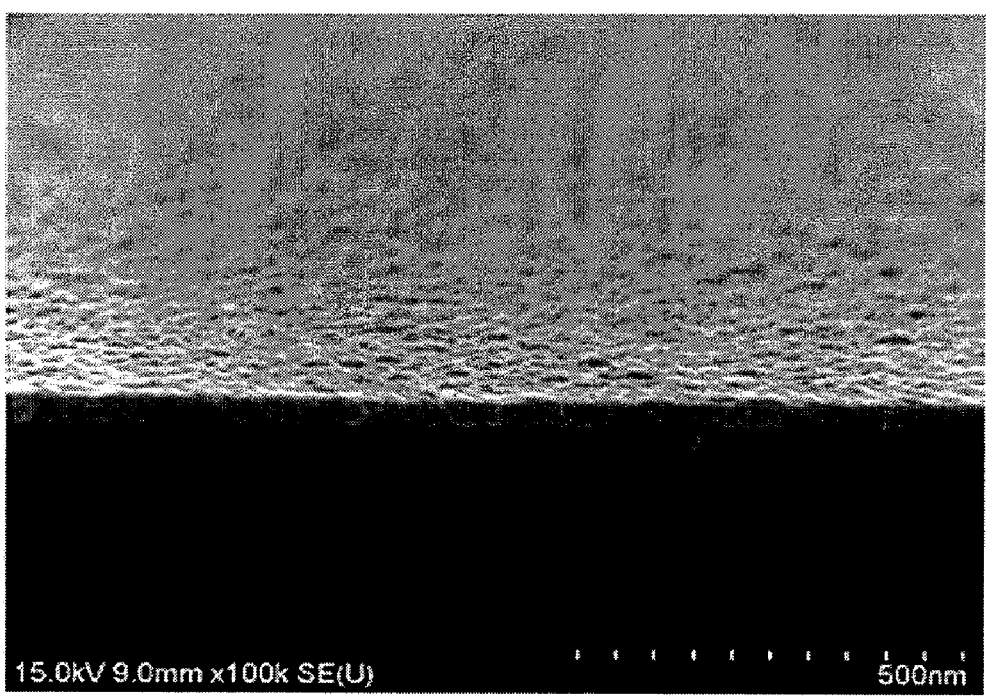

FIGS. 5A and 5B are micrographs of ruthenium films resulting from a conventional ALD and one of the embodiments described above, respectively. FIG. 5A is a micrograph, taken with a scanning electron microscope, of the surface of a Ru film deposited by a conventional ALD method. FIG. 5B is a micrograph, taken with a scanning electron microscope, of the surface of a Ru film deposited by the embodiment described above in connection with FIG. 3. The ruthenium film of FIG. 5A includes swollen or detached portions on the surface of the film. In contrast, the ruthenium film of FIG. 5B does not have such swollen or detached portions on the surface thereof.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of depositing a ruthenium film, the method comprising:
    loading a substrate into a reactor;
    conducting a plurality of first and second deposition cycles, at least one of the first deposition cycles comprising steps of:
       supplying a ruthenium precursor to the reactor;
       supplying oxygen ($O_2$) gas to the reactor, wherein supplying the oxygen gas comprises supplying the oxygen gas simultaneously with supplying the ruthenium precursor; and
       supplying ammonia ($NH_3$) gas to the reactor after supplying the ruthenium precursor and the oxygen gas without supplying the ruthenium precursor and the oxygen gas;
    after the at least one of the first deposition cycles, conducting one or more second deposition cycles, wherein at least one of the second cycles comprises steps of:
       supplying the ruthenium precursor the reactor; and
       supplying oxygen gas to the reactor after supplying the ruthenium precursor, wherein ammonia gas is not supplied in the second cycles; and
    supplying ammonia gas to the reactor subsequent to the one or more second cycles;
    wherein the temperature of the reactor is maintained at about 200° C. to about 400° C.

2. The method of claim 1, wherein the at least one of the first deposition cycles further comprises purging the reactor after supplying the ruthenium precursor and the oxygen gas and before supplying the ammonia gas.

3. The method of claim 1, further comprising supplying a first purge gas before and/or after supplying the oxygen gas in the at least one of the first deposition cycle.

4. The method of claim 3, wherein a second purge gas is supplied after supplying the first purge gas, and before and/or after supplying the ammonia gas in the at least one of the first deposition cycle.

5. The method of claim 1, wherein the at least one of the first deposition cycles comprises one or more first sub-cycles before supplying the ammonia gas, each of the first sub-cycles comprising steps of:
    supplying the ruthenium precursor and the oxygen gas simultaneously to the reactor; and
    continuing to supply the oxygen gas to the reactor after stopping supply of the ruthenium precursor.

6. The method of claim 5, wherein each of the first sub-cycles further comprises increasing the flow rate of the oxygen gas during continuing to supply the oxygen gas and after supplying the ruthenium precursor.

7. The method of claim 6, further comprising supplying a first purge gas before and/or after increasing the flow rate of the oxygen gas.

8. The method of claim 7, wherein supplying the purge gas further comprises supplying a second purge gas after supplying the first purge gas, after increasing the flow rate of the oxygen gas, and before and/or after supplying the ammonia gas.

9. The method of claim 1, wherein the at least one of the second cycles further comprises supplying a purge gas after supplying the ruthenium precursor, and before and/or after supplying the oxygen gas.

10. The method of claim 1, further comprising supplying a purge gas after supplying the oxygen gas simultaneously with supplying the ruthenium precursor and before supplying the ammonia gas.

11. The method of claim 1, further comprising, after supplying the ammonia gas prior to the at least one second cycle, supplying a purge gas during:
    a first time period before supplying the ruthenium precursor in the at least one second cycle;
    a second time period after supplying the ruthenium precursor in the at least one second cycle and before supplying the oxygen gas in the at least one second cycle;
    a third time period after supplying the oxygen gas in the at least one second cycle and before supplying the ammonia gas subsequent to the at least one second cycle; and/or
    a fourth time period after supplying the ammonia gas subsequent to the at least one second cycle.

12. The method of claim 1, wherein the ruthenium precursor comprises a compound represented by Ru(XaXb), wherein Xa and Xb are, respectively, any one of cyclopentadienyl (Cp), methylcyclopentadienyl (MeCp), ethylcyclopentadienyl (EtCp) and isopropylcyclopentadienyl (i-PrCp), or one or more of ruthenium octanedionate ($Ru(OD)_3$), ruthenium tetramethylheptadionate ($Ru(thd)_3$), or $RuO_4$.

13. The method of claim 1, wherein a ruthenium oxide layer is formed on the substrate by supplying the ruthenium precursor to the reactor and supplying the oxygen gas to the reactor, and wherein at least a portion of the ruthenium oxide layer is reduced to ruthenium by supplying the ammonia gas.

14. The method of claim 1, wherein supplying the ammonia gas comprises supplying the ammonia gas for a period of time equal to or less than 10 minutes.

15. A method of depositing a ruthenium film, the method comprising:
    loading a substrate into a reactor; and
    conducting a plurality of deposition cycles, at least one of the cycles comprising steps of:
       supplying a ruthenium precursor to the reactor;
       supplying an oxygen-source gas to the reactor to deposit oxidized ruthenium on the substrate, wherein supplying the oxygen-source gas comprises supplying the oxygen-source gas simultaneously with supplying the ruthenium precursor; and
       reducing the oxidized ruthenium deposited on the substrate to ruthenium with non-plasma ammonia ($NH_3$) gas thereby forming greater than one complete monolayer of ruthenium; and
    after supplying the ammonia gas, conducting one or more second cycles, wherein at least one of the second cycles comprises steps of:
       supplying the ruthenium precursor the reactor; and supplying oxygen-source gas to the reactor after supplying the ruthenium precursor, wherein ammonia gas is not supplied in the second cycles and after the one or more second cycles, supplying ammonia gas to the reactor.

16. The method of claim 15, wherein the ruthenium precursor comprises a compound containing at least one ruthenium atom and one or more ligands bonding to the ruthenium atom.

17. The method of claim 15, wherein the oxygen-source gas comprises oxygen gas ($O_2$) and/or ozone ($O_3$) gas.

18. The method of claim 15, wherein the at least one of the cycles comprises a number of sub-cycles, each of the sub-cycles including supplying a ruthenium precursor to the reactor and supplying an oxygen-source gas to the reactor, wherein the number is selected such that a ruthenium film resulting from the plurality of deposition cycles is substantially free of pores therein.

* * * * *

UNITED STATES PATENT AND TRADEMARK OFFICE
CERTIFICATE OF CORRECTION

PATENT NO. : 8,273,408 B2  
APPLICATION NO. : 12/250827  
DATED : September 25, 2012  
INVENTOR(S) : Kim et al.

It is certified that error appears in the above-identified patent and that said Letters Patent is hereby corrected as shown below:

In column 1 (page 3 item 56) at line 72, Under Other Publications, change "Toulene" to --Toluene--.

In column 2 (page 4 item 56) at line 19, Under Other Publications, change "Hexafluoracetylacetone" to --Hexafluoroacetylacetone--.

In column 2 (page 4 item 56) at line 53, Under Other Publications, change "Relaiability" to --Reliability--.

In column 2 at line 11, Change "(NH3)" to --$(NH_3)$--.

In column 2 at line 21, Change "(NH3)" to --$(NH_3)$--.

In column 4 at line 7, Change "Table 1," to --Table 1.--.

In column 4 at line 39, Change "cyclopentadienyl(Cp)," to --cyclopentadienyl (Cp),--.

In column 4 at line 39-40, Change "methylcyclopentadienyl(MeCp)," to --methylcyclopentadienyl (MeCp),--.

In column 4 at line 40, Change "ethylcyclopentadienyl(EtCp)" to --ethylcyclopentadienyl (EtCp)--.

In column 4 at line 40-41, Change "isopropylcyclopentadienyl(i-PrCp)." to --isopropylcyclopentadienyl (i-PrCp).--.

In column 4 at line 43, Change "ruthenium(Ru(Cp)$_2$)" to --ruthenium (Ru(Cp)$_2$)--.

In column 4 at line 47-48, Change "tetramethylheptadionate(Ru(thd)$_3$)," to --tetramethylheptadionate Ru(thd)$_3$),--.

In column 5 at line 35, Change "(RuOx)" to --$(RuO_x)$--.

In column 11 at line 39, In Claim 1, after "precursor" insert --to--.

In column 12 at line 67, In Claim 15, after "precursor" insert --to--.

Signed and Sealed this  
Twenty-sixth Day of February, 2013

Teresa Stanek Rea  
*Acting Director of the United States Patent and Trademark Office*